United States Patent
Im et al.

(10) Patent No.: US 9,013,031 B2
(45) Date of Patent: Apr. 21, 2015

(54) SEMICONDUCTOR PACKAGES INCLUDING HEAT DIFFUSION VIAS AND INTERCONNECTION VIAS

(71) Applicants: Yunhyeok Im, Hwasung-si (KR); Jichul Kim, Yongin-si (KR); Kyol Park, Daejeon (KR); Seongho Shin, Hwasung-si (KR)

(72) Inventors: Yunhyeok Im, Hwasung-si (KR); Jichul Kim, Yongin-si (KR); Kyol Park, Daejeon (KR); Seongho Shin, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/185,394

(22) Filed: Feb. 20, 2014

(65) Prior Publication Data

US 2014/0367860 A1    Dec. 18, 2014

(30) Foreign Application Priority Data

Jun. 18, 2013  (KR) .................. 10-2013-0069754

(51) Int. Cl.

| | |
|---|---|
| H01L 23/02 | (2006.01) |
| H01L 23/36 | (2006.01) |
| H01L 23/34 | (2006.01) |
| H01L 23/48 | (2006.01) |

(52) U.S. Cl.
CPC .............. *H01L 23/34* (2013.01); *H01L 23/481* (2013.01)

(58) Field of Classification Search
USPC ......... 257/276, 625, 675, 705, 706, 707, 712, 257/717, 720, 722, 796, E33.075, E31.131, 257/E23.051, E23.08–E23.113, 685, 686, 257/777, E25.006, E25.013, E25.021, 257/E25.027, E23.085, E23.067, E23.168; 438/109, 122, FOR. 368, FOR. 426, 438/FOR. 413

See application file for complete search history.

(56) References Cited

U.S. PATENT DOCUMENTS

| 4,698,662 | A | * | 10/1987 | Young et al. .................. 257/777 |
| 6,778,398 | B2 | | 8/2004 | Wyland |
| 6,899,815 | B2 | | 5/2005 | Coomer et al. |
| 8,030,134 | B2 | | 10/2011 | Kwon et al. |

(Continued)

FOREIGN PATENT DOCUMENTS

| JP | 2005-26469 A | 1/2005 |
| JP | 2012-9713 A | 1/2012 |
| KR | 10-2007-0076084 A | 7/2007 |

OTHER PUBLICATIONS

Tak et al., "Electrochemical Properties of Metal Aluminum and Its Application" *J. Korean Ind. Eng. Chem.*, 17(4):335-342 (Aug. 2006).

(Continued)

*Primary Examiner* — Jasmine Clark
(74) *Attorney, Agent, or Firm* — Myers Bigel Sibley & Sajovec, P.A.

(57) ABSTRACT

A semiconductor package includes a lower package including a lower semiconductor chip on a lower package substrate, an upper package on the lower package, and a heat interface material between the lower package and the upper package. The upper package includes an upper semiconductor chip on an upper package substrate including a center portion adjacent to the lower semiconductor chip and an edge portion. The heat interface material is in contact with a top surface of the lower semiconductor chip and the upper package substrate. The upper package substrate includes a heat diffusion via penetrating the center portion and an interconnection via penetrating the edge portion. The interconnection via is spaced apart from the heat diffusion via.

20 Claims, 6 Drawing Sheets

(56) References Cited

U.S. PATENT DOCUMENTS

| | | |
|---|---|---|
| 8,048,358 B2 | 11/2011 | Takano et al. |
| 8,125,066 B1 * | 2/2012 | Kang ............................ 257/686 |
| 8,304,880 B2 * | 11/2012 | Chow et al. .................... 257/686 |
| 8,462,511 B2 | 6/2013 | Lee |
| 2005/0110166 A1 | 5/2005 | Aoyagi |
| 2007/0114677 A1 | 5/2007 | Kwon et al. |
| 2011/0304035 A1 | 12/2011 | Kim et al. |
| 2011/0316151 A1 | 12/2011 | Ozawa et al. |

OTHER PUBLICATIONS

Photograph from Chonbuk National University Oxide Laboratory, downloaded Feb. 20, 2014 from http://oxide.chonbuk.ac.kr/rt/Gallery/aao-sem6.jpg.

* cited by examiner

SEMICONDUCTOR PACKAGES INCLUDING HEAT DIFFUSION VIAS AND INTERCONNECTION VIAS

CROSS-REFERENCE TO RELATED APPLICATION

This U.S. non-provisional patent application claims priority under 35 U.S.C. §119 to Korean Patent Application No. 10-2013-0069754, filed on Jun. 18, 2013, in the Korean Intellectual Property Office, the disclosure of which is hereby incorporated by reference in its entirety.

BACKGROUND

The inventive concepts relate to semiconductor packages and, more particularly, to semiconductor packages that can provide improved heat exhaust characteristics.

As performance of electronic products has been improved, heat energies generated from devices used in electronic products have increased. In order to reduce heat generation problems of the devices, performance of the devices may be limited to control temperatures of the devices when the temperatures of the devices become equal or greater than a specific temperature. However, as generated heat energies increase, temperatures of the devices may rapidly increase such that performances of the devices may be reduced.

SUMMARY

Embodiments of the inventive concepts may provide semiconductor packages that can provide excellent heat exhaust efficiency.

The features of the inventive concept are not limited to the aforesaid, but other features not described herein will be clearly understood by those skilled in the art from descriptions below.

According to example embodiments of the inventive concepts, a semiconductor package may include a lower package including a lower semiconductor chip on a lower package substrate, an upper package on the lower package, the upper package including an upper semiconductor chip on an upper package substrate including a center portion adjacent to the lower semiconductor chip and an edge portion, and a heat interface material between the lower package and the upper package. The heat interface material contacts a top surface of the lower semiconductor chip and the upper package substrate. The upper package substrate may comprise a heat diffusion via penetrating the center portion of the upper package substrate, and an interconnection via penetrating the edge portion of the upper package substrate. The interconnection via may be spaced apart from the heat diffusion via.

In example embodiments, the lower package may further comprise a lower package molding layer exposing the heat interface material and extending on the lower semiconductor chip on the lower package substrate, and an electrical interconnection part penetrating the lower package molding layer on the lower package substrate, the electrical interconnection part contacting the interconnection via.

In example embodiments, the heat diffusion via may comprise a vertical heat diffusion via and a horizontal heat diffusion via. The vertical heat diffusion via penetrates the upper package substrate in a vertical direction to a bottom surface of the upper package substrate. The horizontal heat diffusion via may extend from a sidewall of the vertical heat diffusion via in a direction parallel to the bottom surface of the upper package substrate and further extend to penetrate a top surface of the upper package substrate.

In example embodiments, the vertical heat diffusion via may transfer heat generated from the lower semiconductor chip to the upper package substrate in the vertical direction, and the horizontal heat diffusion via may transfer the heat in the direction parallel to the bottom surface of the upper package substrate.

In example embodiments, the semiconductor package may further comprise a heat diffusion metal pad disposed between the bottom surface of the upper package substrate and a top surface of the heat interface material, and a heat exhaust pad disposed on the top surface of the upper package substrate. The heat exhaust pad may be in contact with the horizontal heat diffusion via.

In example embodiments, the heat diffusion via and the interconnection via may comprise a same metal material, the upper package substrate except the heat diffusion via and the interconnection via may comprise a porous insulation material having pores.

In example embodiments, the metal material may comprise aluminum (Al).

In example embodiments, the porous insulation material may comprise aluminum oxide ($Al_2O_3$), and the pores may contain therein a polymer material.

In example embodiments, the heat interface material may be spaced apart from an upper portion of the electrical interconnection part exposed by the lower package molding layer.

In example embodiments, the heat interface material may spaced apart from an upper portion of the electrical interconnection part exposed by the lower package molding layer.

In example embodiments, the heat interface material may be in contact with an upper portion of the electrical interconnection part exposed by the lower package molding layer.

According to example embodiments of the inventive concepts, a semiconductor package may include a lower package including a lower semiconductor chip on a lower package substrate, an upper package on the lower package, the upper package including an upper semiconductor chip on an upper package substrate including a center portion adjacent to the lower semiconductor chip and an edge portion, and a heat interface material between the lower package and the upper package, the heat interface material contacting a top surface of the lower semiconductor ship and the upper package substrate. First internal insulation patterns and second insulation patterns may be disposed within the center portion of the upper package substrate. The first internal insulation patterns may be in contact with a top surface of the upper package substrate and may be spaced part from each other. The second internal insulation patterns may be in contact with a bottom surface of the upper package substrate and correspond to the first internal insulation patterns, respectively.

In example embodiments, the upper package substrate may comprise horizontal heat diffusion vias and vertical heat diffusion vias. A respective one of the horizontal heat diffusion vias may be disposed between a respective one of the first internal insulation patterns and a respective one of the second internal insulation patterns. A respective one of the vertical heat diffusion vias may include a first vertical heat diffusion via disposed in the edge portion of the upper package substrate, and a second vertical heat diffusion via disposed between the horizontal heat diffusion vias in the center portion of the upper package substrate.

In example embodiments, a height of the vertical heat diffusion vias may be equal to a height of the upper package substrate.

In example embodiments, the horizontal heat diffusion vias and the vertical heat diffusion vias may comprise aluminum (Al).

In example embodiments, the first internal insulation patterns and the second internal insulation patterns may comprise a porous insulation material having pores, the porous insulation material may be aluminum oxide ($Al_2O_3$), and the pores may include therein a polymer material.

According to other example embodiments, a semiconductor package comprises a substrate having opposing faces, an edge portion and a center portion. A heat diffusion via extends to the opposing faces in the center portion, the heat diffusion via being electrically conductive but not configured to electrically connect to a semiconductor chip. An interconnection via extends to the opposing faces in the edge portion, the interconnection via being electrically conductive and configured to electrically connect to a semiconductor chip. A heat diffusion extension includes a buried portion that extends laterally from the heat diffusion via beneath the opposing faces and a penetrating portion that extends from the buried portion, remote from the heat diffusion via, to at least one of the opposing faces. The heat diffusion extension is electrically conductive but not configured to electrically connect to a semiconductor chip.

In example embodiments, the semiconductor package further comprises a semiconductor chip on the center portion of the substrate. The semiconductor chip is thermally connected but not electrically connected to the heat diffusion via and is electrically connected to the interconnection via. The penetrating portion of the heat diffusion extension is laterally offset from the semiconductor chip.

In example embodiments, the buried portion extends laterally from and at least partially surrounds the heat diffusion via and the penetrating portion extends from the buried portion and at least partially surrounds the heat diffusion via.

In example embodiments, the penetrating portion further extends away from the heat diffusion via beyond the interconnection via. In example embodiments, the penetrating portion extends to only one of the opposing faces that is adjacent the semiconductor chip.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
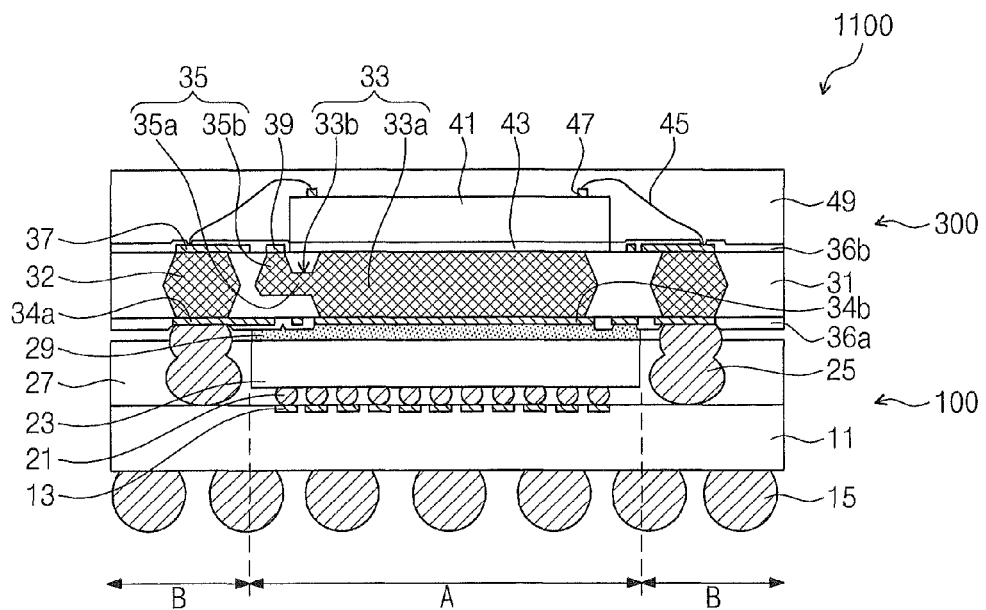
FIG. 1 is a cross-sectional view illustrating a semiconductor package according to a first embodiment of the inventive concepts.

The inventive concepts will now be described more fully hereinafter with reference to the accompanying drawings, in which example embodiments of the inventive concepts are shown. Advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Spatially relative terms, such as "beneath," "below," "bottom," "above," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
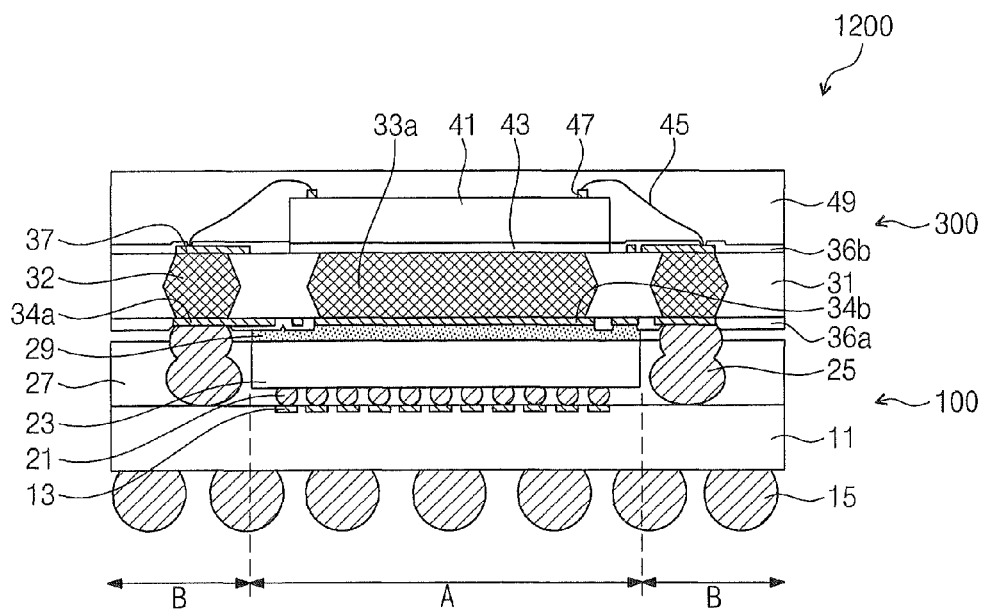
FIG. 2 is a cross-sectional view illustrating a semiconductor package according to a second embodiment of the inventive concepts.
Figure 3:
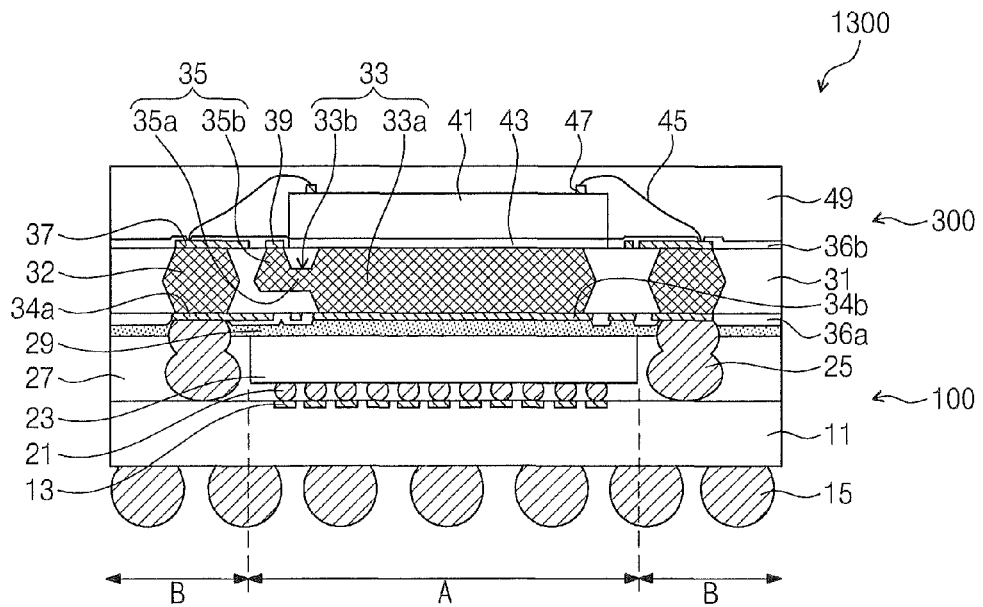
FIG. 3 is a cross-sectional view illustrating a semiconductor package according to a third embodiment of the inventive concepts.

FIG. 1 is a cross-sectional view illustrating a semiconductor package according to a first embodiment of the inventive concepts. FIG. 2 is a cross-sectional view illustrating a semiconductor package according to a second embodiment of the inventive concepts. FIG. 3 is a cross-sectional view illustrating a semiconductor package according to a third embodiment of the inventive concepts.

Referring to FIG. 1, a semiconductor package 1100 includes a lower package 100 and an upper package 300 stacked on the lower package 100. The semiconductor package 1100 is a package-on-package (POP) device.

The lower package 100 may include a lower package substrate 11, a lower semiconductor chip 23 disposed on the lower package substrate 11, and chip bumps 21 electrically connecting the lower package substrate 11 to the lower semiconductor chip 23.

The lower package substrate 11 may be a multi-layered printed circuit board (PCB). Even though not shown in the drawings, the lower package substrate 11 may include a plurality of insulating layers (not shown) and internal wires (not shown) disposed between the insulating layers. Chip pads 13 may be provided on a top surface of the lower package substrate 11, and external terminals 15 may be provided on a bottom surface of the lower package substrate 11. The external terminals 15 may electrically connect the semiconductor package 1100 to an external device.

The lower semiconductor chip 23 is disposed on the chip pads 13. The chip bumps 21 may be bonded to a bottom surface of the lower semiconductor chip 23. The chip bumps 21 may be in contact with the chip pads 13, so that the lower package substrate 11 may be electrically connected to the lower semiconductor chip 23. For example, the lower semiconductor chip 23 may be a logic device (e.g., a microprocessor) or a memory device. Alternatively, a portion of the lower semiconductor chip 23 may be a memory device, and another portion of the lower semiconductor chip 23 may be a logic device and/or other device.

A lower package molding layer 27 may be disposed on the lower package substrate 11 having the semiconductor chip 23. The lower package molding layer 27 may be on, and in some embodiments may cover, a sidewall of the lower semiconductor chip 23 and may completely fill a space between the chip bumps 21. The lower package molding layer 27 may expose a top surface of the lower semiconductor chip 23. One or more electrical interconnection parts 25 penetrating the lower package molding layer 27 may be disposed on the lower package substrate 11. The electrical interconnection parts 25 may be disposed to be spaced apart from the lower semiconductor chip 23 at both sides of the lower semiconductor chip 23. The electrical interconnection parts 25 may electrically connect the lower package substrate 11 to an upper package substrate 31. A height of the electrical interconnection part 25 is higher than a height of the lower package molding layer 27. Thus, an upper portion of the electrical interconnection part 25 may protrude from a top surface of the lower package molding layer 27.

The upper package 300 includes the upper package substrate 31, an upper semiconductor chip 41 disposed on the upper package substrate 31, and bonding wires 45 electrically connecting the upper semiconductor chip 41 to the upper package substrate 31.

The upper package substrate 31 includes a center portion A and an edge portion B. The upper package substrate 31 is on the electrical interconnection parts 25. The upper package substrate 31 may include interconnection vias 32 and a heat diffusion via 33. The interconnection vias 32 may penetrate a portion of the edge portion B of the upper package substrate 31 and may be disposed to face the electrical interconnection parts 25. The heat diffusion via 33 may penetrate a portion of the center portion A of the upper package substrate 31. The heat diffusion via 33 may be disposed to be adjacent to the lower semiconductor chip 23. The heat diffusion via 33 may include a vertical heat diffusion via 33a and a horizontal heat diffusion via 33b. In some embodiments, the vertical heat diffusion via 33a may penetrate the upper package substrate 31 in a vertical direction to a bottom surface of the upper package substrate 31. The horizontal heat diffusion via 33b may extend from a sidewall of the vertical heat diffusion via 33a in a parallel direction to the bottom surface of the upper package substrate 31 and may further extend to a top surface of the upper package substrate 31. Alternatively, the upper package substrate 31 may not include the horizontal heat diffusion via 33b in a semiconductor package 1200 of FIG. 2 according to a second embodiment of the inventive concepts.

Embodiments of FIG. 1 also describe a semiconductor package 1100 that comprises a substrate 31 having opposing faces, an edge portion B and a center portion A. A heat diffusion via 33a extends to the opposing faces in the center portion A. The heat diffusion via 33a is electrically conductive, but not configured to electrically connect to a semiconductor chip 23 or 41. An interconnection via 32 extends to the opposing faces in the edge portion B. The interconnection via 32 is electrically conductive and is configured to electrically connect to a semiconductor chip 23 and/or 41. A heat diffusion extension 35 includes a buried portion 35a that extends laterally from the heat diffusion via 33a beneath the opposing faces, and a penetrating portion 35b that extends from the buried portion 35a remote from the heat diffusion via 33a, to at least one of the opposing faces. The heat diffusion extension 35 is electrically conductive, but is not configured to electrically connect to a semiconductor chip.

Moreover, FIG. 1 also illustrates various embodiments wherein a semiconductor chip 41 is provided on the center portion A of the substrate 31. The semiconductor chip 41 is thermally connected but not electrically connected to the heat diffusion via 33a, and is electrically connected to the interconnection via 32. Moreover, the penetrating portion 35b of the heat diffusion extension 35 is laterally offset from the semiconductor chip 41. FIG. 1 also illustrates various embodiments wherein the buried portion 35a extends laterally from and at least partially surrounds the heat diffusion via 33a, and the penetrating portion 35b extends from the buried portion 35a and at least partially surrounds the heat diffusion via 33a. Finally, FIG. 1 also illustrates various embodiments wherein the penetrating portion 35b extends to only one of the opposing faces that is adjacent the semiconductor chip 41.

The interconnection vias 32 and the heat diffusion via 33 may comprise a metal material. For example, the metal material may comprise aluminum (Al). The upper package substrate 31 except the interconnection via 32 and the heat diffusion via 33 may comprise a porous insulation material. In more detail, the porous insulation material may comprise aluminum oxide ($Al_2O_3$). The porous insulation material includes pores. A polymer material may be included in, and in some embodiments may fill, the pores.

One or more interconnection metal pads 34a and a heat diffusion metal pad 34b may be disposed on the bottom surface of the upper package substrate 31. The interconnection metal pad 34a may be in contact with the interconnection via 32, and the heat diffusion metal pad 34b may be in contact with the heat diffusion via 33. The interconnection metal pad 34a may be disposed between the electrical interconnection part 25 and the interconnection via 32 and may be in contact with the electrical interconnection part 25. The interconnection and heat diffusion metal pads 34a and 34b may include copper (Cu).

A separation space may exist between the top surface of the lower semiconductor chip 23 and the bottom surface of the upper package substrate 31 on which the interconnection and heat diffusion metal pads 34a and 34b are disposed. The separation space may contain, and in some embodiments may be filled with, a heat transfer layer 29. In more detail, the heat transfer layer 29 may be disposed on the top surface of the lower semiconductor chip 23 and may be in contact with the heat diffusion metal pad 34b. The heat transfer layer 29 may include a thermal interface material (TIM). A first solder resist layer 36a may be conformally formed on the bottom surface of the upper package substrate 31.

According to a third embodiment of the inventive concepts, the heat transfer layer 29 may completely fill a separation space between the lower package 100 and the upper package 300 in a semiconductor package 1300 illustrated in FIG. 3. In more detail, the heat transfer layer 29 may be disposed on the top surface of the lower semiconductor chip 23 and the lower package molding layer 27 exposing the top surface of the lower semiconductor chip 23. The heat transfer layer 29 may be in contact with the electrical connection parts 25 protruding from the top surface of the lower package molding layer 27.

Wire pads 37 and a heat exhaust pad 39 may be disposed on a top surface of the upper package substrate 31. The wire pad 37 may be in contact with the interconnection via 32, and the heat exhaust pad 39 may be in contact with the horizontal heat diffusion via 33b. The wire and heat exhaust pads 37 and 39 may include copper (Cu).

The upper semiconductor chip 41 may be disposed on the upper package substrate 31. In more detail, the upper semiconductor chip 41 may be disposed on the vertical heat diffusion via 33a. For example, the upper semiconductor chip 41 may be a logic device (e.g., a micro-processor) or a memory device. Alternatively, a portion of the upper semiconductor chip 41 may be a memory device and another portion of the upper semiconductor chip 41 may be a logic device and/or another device. The upper semiconductor chip 41 may be joined to the upper package substrate 31 by a chip contact film 43 on a bottom surface of the upper semiconductor chip 41.

Bonding pads 47 disposed on the upper semiconductor chip 41 may be electrically connected to the wire pads 37 through the bonding wires 45. A second solder resist layer 36b may be further formed to conformally cover the wire and heat exhaust pads 37 and 39 on the top surface of the upper package substrate 31. An upper package molding layer 49 may be disposed on the upper package substrate 31 on which the upper semiconductor chip 41 is mounted. The upper package molding layer 49 may be formed to extend on, and in some embodiments completely cover, the bonding wires 45 and the upper semiconductor chip 41.

Heat generated from the lower semiconductor chip 23 is transferred to the upper package substrate 31 through the heat transfer layer 29. A PCB used as a conventional upper package substrate may comprise bismaleimidetriazine (BT), and a heat conductivity of the bismaleimidetriazine (BT) is about 0.5 W/mK. Thus, heat generated from a lower semiconductor chip may not be easily exhausted to the outside such that the lower semiconductor chip may be damaged.

According to some embodiments of the inventive concepts, the heat diffusion via 33 is formed in the upper package substrate 31 so as to be adjacent to the lower semiconductor chip 23. The heat diffusion via 33 includes the metal material so that a heat conductivity of the heat diffusion via 33 is excellent. For example, the heat diffusion via 33 includes aluminum (Al). A heat conductivity of the aluminum (Al) is about 210 W/mK. Thus, the heat generated from the lower semiconductor chip 23 may be smoothly exhausted through the heat diffusion via 33. In more detail, the vertical heat diffusion via 33a of the heat diffusion via 33 transfers the heat in a vertical direction from the lower semiconductor chip 23 to the upper package substrate 31, and the horizontal heat diffusion via 33b may diffuse the heat in a horizontal direction. In other words, the horizontal heat diffusion via 33b may disperse a temperature distribution to prevent a hot spot which may occur in the upper package substrate 31 from being formed. Thus, a heat exhaust characteristic of the semiconductor package 1100 may be improved.

Additionally, since the interconnection via 32 of the upper package substrate 31 is a metal material, a coupling phenomenon between electrical signals may be improved.

Figure 4:
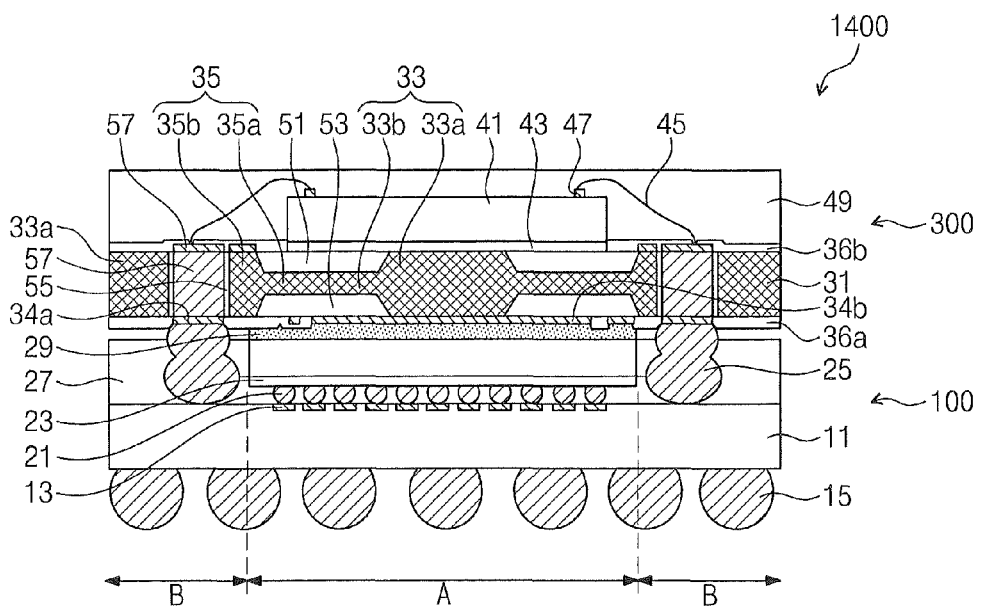
FIG. 4 is a cross-sectional view illustrating a semiconductor package according to a fourth embodiment of the inventive concepts.

FIG. 4 is a cross-sectional view illustrating a semiconductor package according to a fourth embodiment of the inventive concepts. In the present embodiment illustrated in FIG. 4, for the purpose of ease and convenience in explanation, the same elements as described above will be indicated by the same reference numerals or the same reference designators and the descriptions to the same elements as described above will be omitted or mentioned briefly.

Referring to FIG. 4, a semiconductor package 1400 may include a pair of first internal insulation patterns 51 and a pair of second internal insulation patterns 53 which are disposed within the center portion A of the upper package substrate 31. The pair of first internal insulation patterns 51 may be in contact with the top surface of the upper package substrate 31 and may be disposed to be spaced apart from each other. The pair of second internal insulation patterns 53 may be in contact with the bottom surface of the upper package substrate 31 and may be disposed to face the first internal insulation patterns 51, respectively. The vertical heat diffusion via 33a and horizontal heat diffusion vias 33b may be disposed within the center portion A of the upper package substrate 31. In more detail, a respective one of the horizontal heat diffusion vias 33b may be disposed between a respective one of the first internal insulation patterns 51 and a respective one of the second internal insulation patterns 53 facing each other. The vertical heat diffusion via 33a may be disposed between the horizontal heat diffusion vias 33b. The first and second internal insulation patterns 51 and 53 may comprise the porous insulation material having the pores. The pores may include, and in some embodiments be filled with, the polymer material.

The semiconductor package 1400 may further include a vertical heat diffusion via 33a disposed within the edge portion B of the upper package substrate 31. The vertical heat diffusion via 33a within the edge portion B may be in contact with the heat exhaust pad 39. As illustrated in FIG. 4, the horizontal heat diffusion via 33b may be connected to both the vertical heat diffusion via 33a within the center portion A and the vertical heat diffusion via 33a within the edge portion B. A height of the vertical heat diffusion via 33a may be equal to a height of the upper package substrate 31. One or more through-vias 57 may be disposed in the edge portion B of the upper package substrate 31. The through-via 57 may penetrate the vertical heat diffusion via 33a in the edge portion B. The through-via 57 may be in contact with the wire pad 37 and the interconnection metal pad 34a. An insulating layer 55 may be disposed between the through-via 53 and the vertical heat diffusion via 33a in the edge portion B. Accordingly, FIG. 4 also illustrates embodiments wherein the penetrating portion 35b further extends away from the heat diffusion via 33a beyond the interconnection via 57.

FIGS. 5A to 5F are cross-sectional views illustrating a method of fabricating an upper package substrate according to some embodiments of the inventive concepts.

Figure 5A:
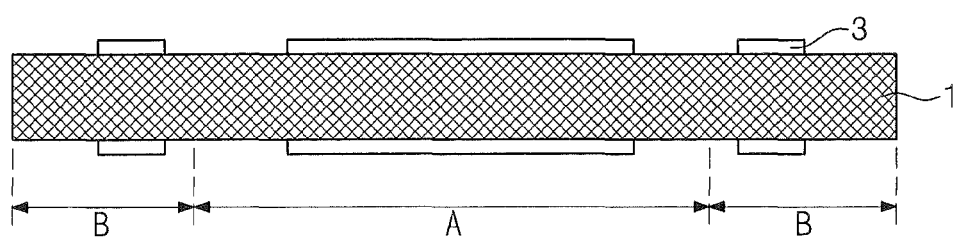
FIGS. 5A to 5F are cross-sectional views illustrating a method of fabricating an upper package substrate according to some embodiments of the inventive concepts.

Referring to FIG. 5A, photoresist patterns 3 are formed on a top surface and a bottom surface of a substrate 1. The substrate 1 may be an aluminum substrate.

Figure 5B:
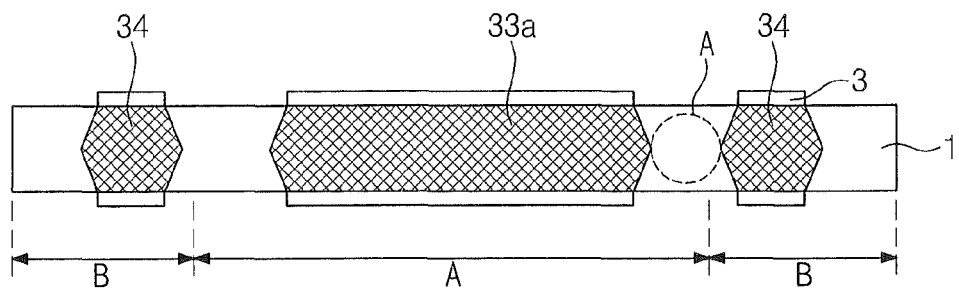
Figure 5C:
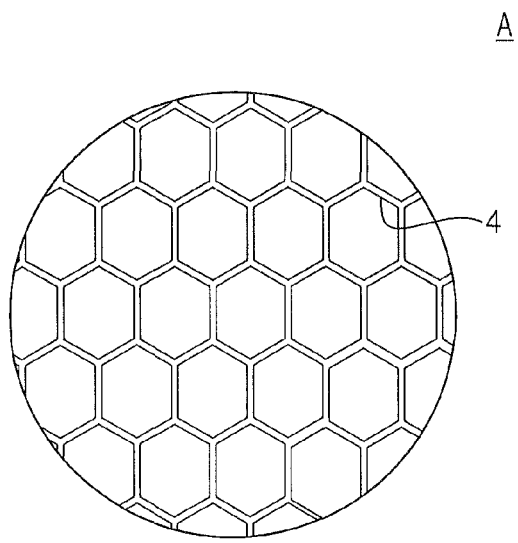

FIG. 5C is an enlarged view of a portion 'A' of FIG. 5B. Referring to FIGS. 5B and 5C, the substrate 1 exposed by the photoresist patterns 3 is selectively oxidized. For example, the substrate 1 may be oxidized by an electrical chemical etching method. In more detail, the electrical chemical etching method may include placing the substrate 1 into an electrolytic solution, and applying a current to the substrate 1. The electrolytic solution may be hydrochloric acid, sulfuric acid, phosphoric acid, chromic acid and/or oxalic acid. The current may be a direct current (DC) and/or an alternating current (AC). By the electrical chemical etching method, a region of the substrate 1 may be formed into a porous insulation material having pores 4, as illustrated in FIG. 5C. The porous insulation material may comprise aluminum oxide ($Al_2O_3$).

Other regions of the substrate 1 protected by the photoresist patterns 3 may be formed into a vertical heat diffusion via 33a and interconnection vias 34. In detail, the vertical heat diffusion via 33a may be formed in a center portion A of the substrate 1, and the interconnection vias 34 may be formed in an edge portion B of the substrate 1.

Figure 5D:
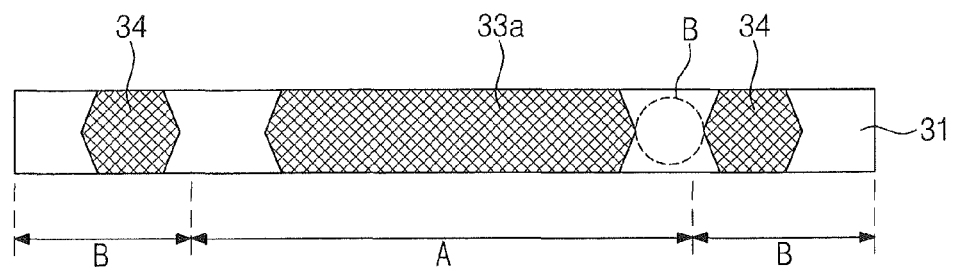
Figure 5E:
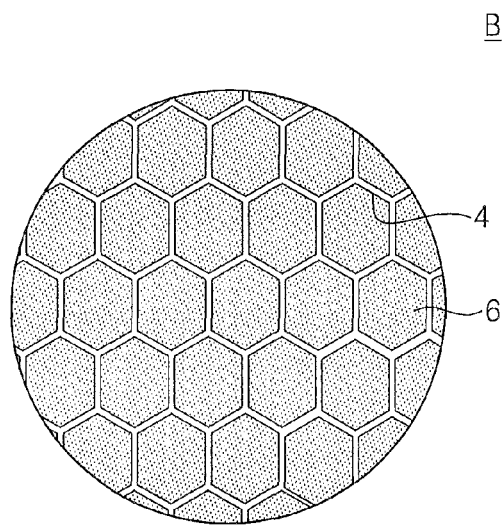

FIG. 5E is an enlarged view of a portion 'B' of FIG. 5D. Referring to FIGS. 5D and 5E, the photoresist patterns 3 are removed. The photoresist patterns 3 may be removed by performing an ashing process. The pores 4 may be filled with a polymer material 6. The substrate 1 may be used as an upper package substrate 31.

Figure 5F:
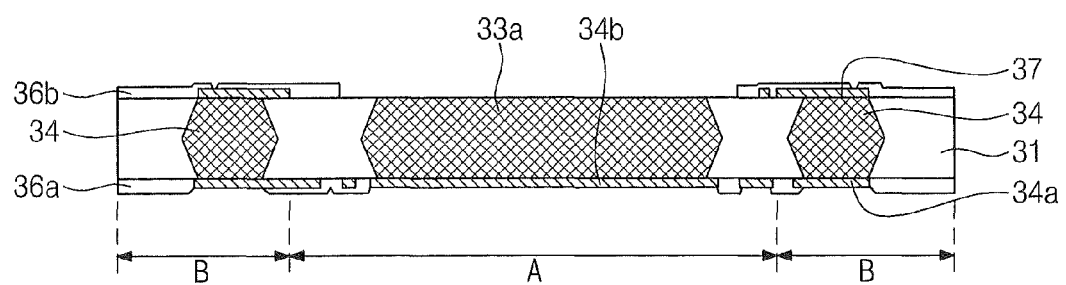

Referring to FIG. 5F, metal pads may be formed on a top surface and a bottom surface of the upper package substrate 31. In more detail, wire pads 37 may be formed on the top surface of the upper package substrate 31. The wire pads 37 may be in contact with the interconnection vias 34. Interconnection metal pads 34a and a heat diffusion metal pad 34b may be disposed on the bottom surface of the upper package substrate 31. The interconnection metal pads 34a may be in contact with the interconnection vias 34, and the heat diffusion metal pad 34b may be in contact with the vertical heat diffusion via 33a. The metal pads 34a and 34b may include copper (Cu).

A first solder resist layer 36a is formed on the bottom surface of the upper package substrate 31. The first solder resist layer 36a may be conformally formed on the bottom surface of the upper package substrate 31 to expose surfaces of the interconnection metal pads 34a and the heat diffusion metal pad 34b. A second solder resist layer 36b is formed on the top surface of the upper package substrate 31. The second solder resist layer 36b may be formed to expose a surface of the vertical heat diffusion via 33a and to partially cover a surface of the wire pad 37. An exposed portion of the surface of the wire pad 37 by the second solder resist layer 36b may be in contact with a bonding wire 45 in a subsequent process.

Referring to FIG. 2 again, an upper semiconductor chip 41 is bonded to the top surface of the upper package substrate 31. The upper semiconductor chip 41 may be bonded to be adjacent to the vertical heat diffusion via 33a. The upper semiconductor chip 41 may be bonded by a chip contact film 43. Bonding pads 47 may be formed on a top surface of the upper semiconductor chip 41.

Bonding wires 45 may be used to connect the bonding pads 47 to the wire pads 37. Thereafter, an upper package molding layer 49 may be used to cover the upper semiconductor chip 41 and the bonding wires 45, thereby completing an upper package 300. The electrical interconnection parts 25 of the lower package 100 may become in contact with the interconnection metal pads 34a disposed on the bottom surface of the upper package substrate 31. Thus, the upper package 300 may be stacked on the lower package 100.

Figure 6:
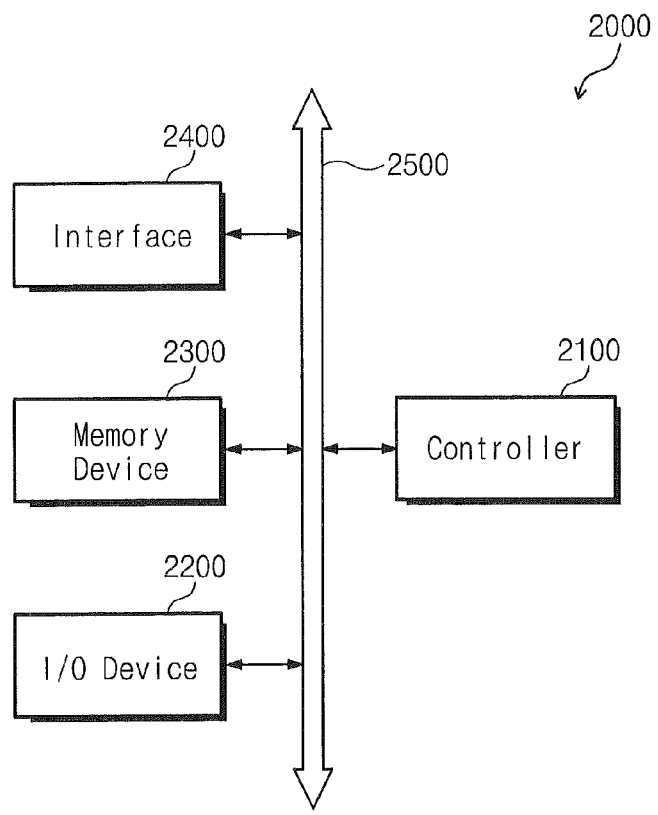
FIG. 6 is a schematic block diagram illustrating an example of electronic systems including a semiconductor package according to embodiments of the inventive concepts.
Figure 7:
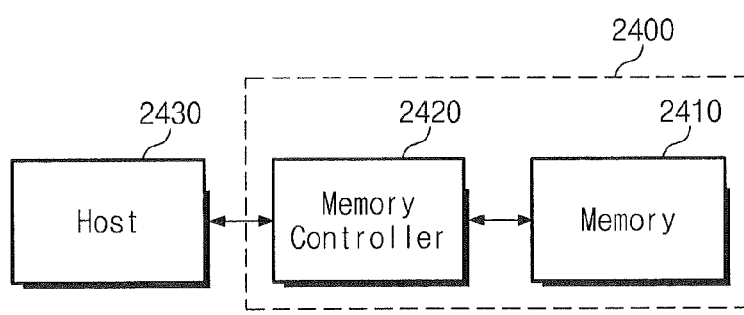
FIG. 7 is a schematic block diagram illustrating an example of memory systems including semiconductor packages according to embodiments of the inventive concepts.

FIG. 6 is a schematic block diagram illustrating an example of electronic systems including semiconductor package according to embodiments of the inventive concepts. FIG. 7 is a schematic block diagram illustrating an example of memory systems including semiconductor packages according to embodiments of the inventive concepts.

Referring to FIG. 6, an electronic system 2000 may include a controller 2100, an input/output (I/O) device 2200, and a memory device 2300. The controller 2100, the I/O device 2200, and the memory device 2300 may communicate with each other through a data bus 2500. The data bus 2500 may correspond to a path through which data are transmitted. For example, the controller 2100 may include at least one of a microprocessor, a digital signal processor, a microcontroller and/or other logic devices having a similar function to any one of the microprocessor, the digital signal processor and the microcontroller. The controller 2100, the I/O device 2200, the memory device 2300 and/or the interface 2400 may include at least one of the semiconductor packages 1100, 1200, 1300, and 1400 according to embodiments of the inventive concepts. The I/O device 2200 may include a keypad, a keyboard and/or a display device. The memory device 2300 stores data. For example, the memory device 2300 may store data and/or commands executed by the controller 2100. The memory device 2300 may include a volatile memory device and/or a non-volatile memory device. In other embodiments, the memory device 2300 may include a flash memory device. For example, the flash memory device applied with technical features of the inventive concepts may be installed in an information processing system such as a mobile device or a desk top computer. The flash memory device of the memory device 2300 may be realized as a solid state disk (SSD). In this case, the electronic system 200 may stably store massive data in the memory device 2300. The electronic system 2000 may further include an interface unit 2400 for transmitting electrical data to a communication network or for receiving electrical data from a communication network. The interface unit 2400 may operate by wireless or cable. For example, the interface unit 2400 may include an antenna for wireless communication or a transceiver for cable communication. Even though not shown in the drawings, the electronic system 2000 may further include an application chipset and/or a camera image processor (CIS).

The electronic system 2000 may be realized as a mobile system, a personal computer, an industrial computer and/or a logic system for performing various functions. For example, the mobile system may be one of a personal digital assistant (PDA), a portable computer, a web tablet, a mobile phone, a wireless phone, a laptop computer, a memory card, a digital music player, and/or an information transmitting/receiving system. If the electronic system 2000 performs wireless communication, the electronic system 2000 may be used in a communication interface protocol such as a third generation communication system (e.g., CDMA, GSM, NADC, E-TDMA, WCDAM, and/or CDMA2000).

Referring to FIG. 7, a memory card 2400 may include a non-volatile memory device 2410 and a memory controller 2420. The non-volatile memory device 2410 and the memory controller 2420 may store data or read stored data. The non-volatile memory device 2410, the memory controller 2420 and/or the host 2430 may include at least one of the semiconductor packages 1100, 1200, 1300, and 1400 according to embodiments of the inventive concepts. The memory controller 2420 may read or write data from/into the non-volatile memory device 2410 in response to read/write request of a host 2430.

According to embodiments of the inventive concepts, the semiconductor package includes the lower package and the upper package on the lower package. The upper package substrate on the lower package including the lower semiconductor chip includes the heat diffusion via. The heat diffusion via is disposed to be adjacent to the lower semiconductor chip. Thus, the heat generated from the lower semiconductor chip may be vertically and/or horizontally diffused through the heat diffusion vias to be exhausted. As a result, the heat exhaust characteristic of the semiconductor package may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a lower package including a lower semiconductor chip on a lower package substrate;
   an upper package on the lower package, the upper package including an upper semiconductor chip on an upper package substrate including a center portion adjacent to the lower semiconductor chip and an edge portion; and
   a heat interface material between the lower package and the upper package, the heat interface material contacting a top surface of the lower semiconductor chip and the upper package substrate,
   wherein the upper package substrate comprises: a heat diffusion via penetrating the center portion of the upper package substrate; and an interconnection via penetrating the edge portion of the upper package substrate, and
   wherein the interconnection via is spaced apart from the heat diffusion via.

2. The semiconductor package of claim 1, wherein the lower package further comprises:
   a lower package molding layer exposing the heat interface material and extending on the lower semiconductor chip on the lower package substrate; and
   an electrical interconnection part penetrating the lower package molding layer on the lower package substrate, the electrical interconnection part contacting the interconnection via.

3. The semiconductor package of claim 1, wherein the heat diffusion via comprises a vertical heat diffusion via and a horizontal heat diffusion via;
   wherein the vertical heat diffusion via penetrates the upper package substrate in a vertical direction to a bottom surface of the upper package substrate; and
   wherein the horizontal heat diffusion via extends from a sidewall of the vertical heat diffusion via in a direction parallel to the bottom surface of the upper package substrate and further extends to penetrate a top surface of the upper package substrate.

4. The semiconductor package 3, wherein the vertical heat diffusion via is configured to transfer heat generated from the lower semiconductor chip to the upper package substrate in the vertical direction; and
   wherein the horizontal heat diffusion via is configured to transfer the heat in the direction parallel to the bottom surface of the upper package substrate.

5. The semiconductor package 3, further comprising:
   a heat diffusion metal pad disposed between the bottom surface of the upper package substrate and a top surface of the heat interface material; and
   a heat exhaust pad disposed on the top surface of the upper package substrate,
   wherein the heat exhaust pad is in contact with the horizontal heat diffusion via.

6. The semiconductor package 1, wherein the heat diffusion via and the interconnection via comprise a same metal material;
   wherein the upper package substrate except the heat diffusion via and the interconnection via comprises a porous insulation material having pores.

7. The semiconductor package of claim 6, wherein the metal material comprises aluminum (Al).

8. The semiconductor package of claim 6, wherein the porous insulation material comprises aluminum oxide ($Al_2O_3$); and
   wherein the pores contain therein a polymer material.

9. The semiconductor package of claim 2, wherein the heat interface material is spaced apart from an upper portion of the electrical interconnection part exposed by the lower package molding layer.

10. The semiconductor package of claim 2, wherein the heat interface material is in contact with an upper portion of the electrical interconnection part exposed by the lower package molding layer.

11. A semiconductor package comprising:
a lower package including a lower semiconductor chip on a lower package substrate;
an upper package on the lower package, the upper package including an upper semiconductor chip on an upper package substrate including a center portion adjacent to the lower semiconductor chip and an edge portion; and
a heat interface material between the lower package and the upper package, the heat interface material contacting a top surface of the lower semiconductor chip and the upper package substrate,
wherein first internal insulation patterns and second internal insulation patterns are disposed within the center portion of the upper package substrate;
wherein the first internal insulation patterns are in contact with a top surface of the upper package substrate and are spaced apart from each other; and
wherein the second internal insulation patterns are in contact with a bottom surface of the upper package substrate and correspond to the first internal insulation patterns, respectively.

12. The semiconductor package of claim 11, wherein the upper package substrate comprises: horizontal heat diffusion vias and vertical heat diffusion vias;
wherein a respective one of the horizontal heat diffusion vias is disposed between a respective one of the first internal insulation patterns and a respective one of the second internal insulation patterns;
wherein the respective one of vertical heat diffusion vias includes a first vertical heat diffusion via disposed in the edge portion of the upper package substrate, and a second vertical heat diffusion via disposed between the horizontal heat diffusion vias in the center portion of the upper package substrate.

13. The semiconductor package of claim 12, wherein a height of the vertical heat diffusion vias is equal to a height of the upper package substrate.

14. The semiconductor package of claim 12, wherein the horizontal heat diffusion vias and the vertical heat diffusion vias comprise aluminum (Al).

15. The semiconductor package of claim 11, wherein the first internal insulation patterns and the second internal insulation patterns comprise a porous insulation material having pores;
wherein the porous insulation material comprises aluminum oxide ($Al_2O_3$); and
wherein the pores include a polymer material therein.

16. A semiconductor package comprising:
a substrate having opposing faces, an edge portion and a center portion;
a heat diffusion via that extends to the opposing faces in the center portion, the heat diffusion via being electrically conductive but not configured to electrically connect to a semiconductor chip;
an interconnection via that extends to the opposing faces in the edge portion, the interconnection via being electrically conductive and configured to electrically connect to a semiconductor chip; and
a heat diffusion extension including a buried portion that extends laterally from the heat diffusion via beneath the opposing faces and a penetrating portion that extends from the buried portion, remote from the heat diffusion via, to at least one of the opposing faces, the heat diffusion extension being electrically conductive but not configured to electrically connect to a semiconductor chip.

17. The semiconductor package of claim 16 further comprising a semiconductor chip on the center portion of the substrate, the semiconductor chip being thermally connected but not electrically connected to the heat diffusion via and being electrically connected to the interconnection via, the penetrating portion of the heat diffusion extension being laterally offset from the semiconductor chip.

18. The semiconductor package of claim 16 wherein the buried portion extends laterally from and at least partially surrounds the heat diffusion via and the penetrating portion extends from the buried portion and at least partially surrounds the heat diffusion via.

19. The semiconductor package of claim 16 wherein the penetrating portion further extends away from the heat diffusion via beyond the interconnection via.

20. The semiconductor package of claim 17 wherein the penetrating portion extends to only one of the opposing faces that is adjacent the semiconductor chip.

* * * * *